(12) United States Patent
Nagaiwa et al.

(10) Patent No.: US 7,732,340 B2
(45) Date of Patent: Jun. 8, 2010

(54) METHOD FOR ADJUSTING A CRITICAL DIMENSION IN A HIGH ASPECT RATIO FEATURE

(75) Inventors: Toshifumi Nagaiwa, Dresden (DE); Junichi Sasaki, Dresden (DE); Stefan Sawusch, Pirna (DE)

(73) Assignee: Tokyo Electron Limited, Tokyo (JP)

( * ) Notice: Subject to any disclaimer, the term of this patent is extended or adjusted under 35 U.S.C. 154(b) by 974 days.

(21) Appl. No.: 11/463,133

(22) Filed: Aug. 8, 2006

(65) Prior Publication Data

US 2008/0038673 A1 Feb. 14, 2008

(51) Int. Cl.
*H01l 21/302* (2006.01)

(52) U.S. Cl. ............... 438/717; 438/706; 438/738; 430/312

(58) Field of Classification Search ............... 438/706, 438/710, 714, 717, 738; 430/310, 312
See application file for complete search history.

(56) References Cited

U.S. PATENT DOCUMENTS

| 6,214,696 B1* | 4/2001 | Wu ............................ 438/424 |
| 2004/0266134 A1* | 12/2004 | Huang et al. ................. 438/424 |
| 2005/0064714 A1* | 3/2005 | Mui et al. .................... 438/706 |

* cited by examiner

*Primary Examiner*—Lan Vinh

(57) ABSTRACT

A method for adjusting the lateral critical dimension (i.e., length and width) of a feature formed in a layer on a substrate using a dry etching process. One or more thin intermediate sub-layers are inserted in the layer within which the feature is to be formed. Once an intermediate sub-layer is reached during the etching process, an etch process is performed to correct and/or adjust the lateral critical dimensions before etching through the intermediate sub-layer and continuing the layer etch.

16 Claims, 18 Drawing Sheets

US 7,732,340 B2

METHOD FOR ADJUSTING A CRITICAL DIMENSION IN A HIGH ASPECT RATIO FEATURE

BACKGROUND OF THE INVENTION

1. Field of the Invention

The present invention relates to a method for forming a feature in a substrate using an etching process, and more particularly to a method for adjusting a critical dimension (CD) of a pattern transferred to a layer on a substrate during an etching process.

2. Description of Related Art

During semiconductor processing, a (dry) plasma etch process can be utilized to remove or etch material along fine lines or within vias or contacts patterned on a silicon substrate. The plasma etch process generally involves positioning a semiconductor substrate with an overlying patterned, protective layer, for example a photoresist layer, in a processing chamber. Once the substrate is positioned within the chamber, an ionizable, dissociative gas mixture is introduced within the chamber at a pre-specified flow rate, while a vacuum pump is throttled to achieve an ambient process pressure.

Thereafter, a plasma is formed when a fraction of the gas species present are ionized by electrons heated via the transfer of radio frequency (RF) power either inductively or capacitively, or microwave power using, for example, electron cyclotron resonance (ECR). Moreover, the heated electrons serve to dissociate some species of the ambient gas species and create reactant specie(s) suitable for the exposed surface etch chemistry. Once the plasma is formed, selected surfaces of the substrate are etched by the plasma. The process is adjusted to achieve appropriate conditions, including an appropriate concentration of desirable reactant and ion populations to etch various features (e.g., trenches, vias, contacts, etc.) in the selected regions of the substrate. Such substrate materials where etching is required can include silicon dioxide ($SiO_2$), low-k dielectric materials, poly-silicon, and silicon nitride, among other materials.

SUMMARY OF THE INVENTION

The present invention relates to a method of forming a feature on a substrate using an etching process.

According to one embodiment, a method is described for adjusting a critical dimension (CD) of a pattern transferred to a layer on a substrate during an etching process.

According to another embodiment, a method is described for adjusting a critical dimension (CD) of a pattern transferred to a layer on a substrate during an etching process by inserting one or more intermediate sub-layers within the layer being etched and adjusting the CD when the etching process reaches each intermediate sub-layer.

According to another embodiment, a method for etching a substrate and a computer readable medium with program instructions to cause a computer system to control an etching process includes forming a film stack on the substrate, the film stack comprising a composite layer, having an upper material layer, an intermediate sub-layer and a lower material layer, and a mask layer overlying the composite layer having a pattern formed therein. The pattern is transferred to the composite layer using one or more etching processes by: transferring the pattern to the upper material layer of the composite layer until the intermediate sub-layer is reached, adjusting at least one critical dimension (CD) of the pattern in the upper material layer, transferring the adjusted pattern in the upper material layer to the intermediate sub-layer, and transferring the adjusted pattern to the lower material layer of the composite layer.

DETAILED DESCRIPTION OF SEVERAL EMBODIMENTS

In the following description, for purposes of explanation and not limitation, specific details are set forth, such as a particular geometry of the plasma processing system and descriptions of various processes. However, it should be understood that the invention may be practiced in other embodiments that depart from these specific details.

In material processing methodologies, pattern etching comprises the application of a thin layer of light-sensitive material, such as photo-resist, to an upper surface of a substrate that is subsequently patterned in order to provide a mask for transferring this pattern to the underlying thin film on a substrate during etching. The patterning of the light-sensitive material generally involves exposure by a radiation source through a reticle (and associated optics) of the light-sensitive material using, for example, a micro-lithography system, followed by the removal of the irradiated regions of the light-sensitive material (as in the case of positive photo-resist), or non-irradiated regions (as in the case of negative resist) using a developing solvent. Moreover, this mask layer may comprise multiple layers.

Figure 1A:
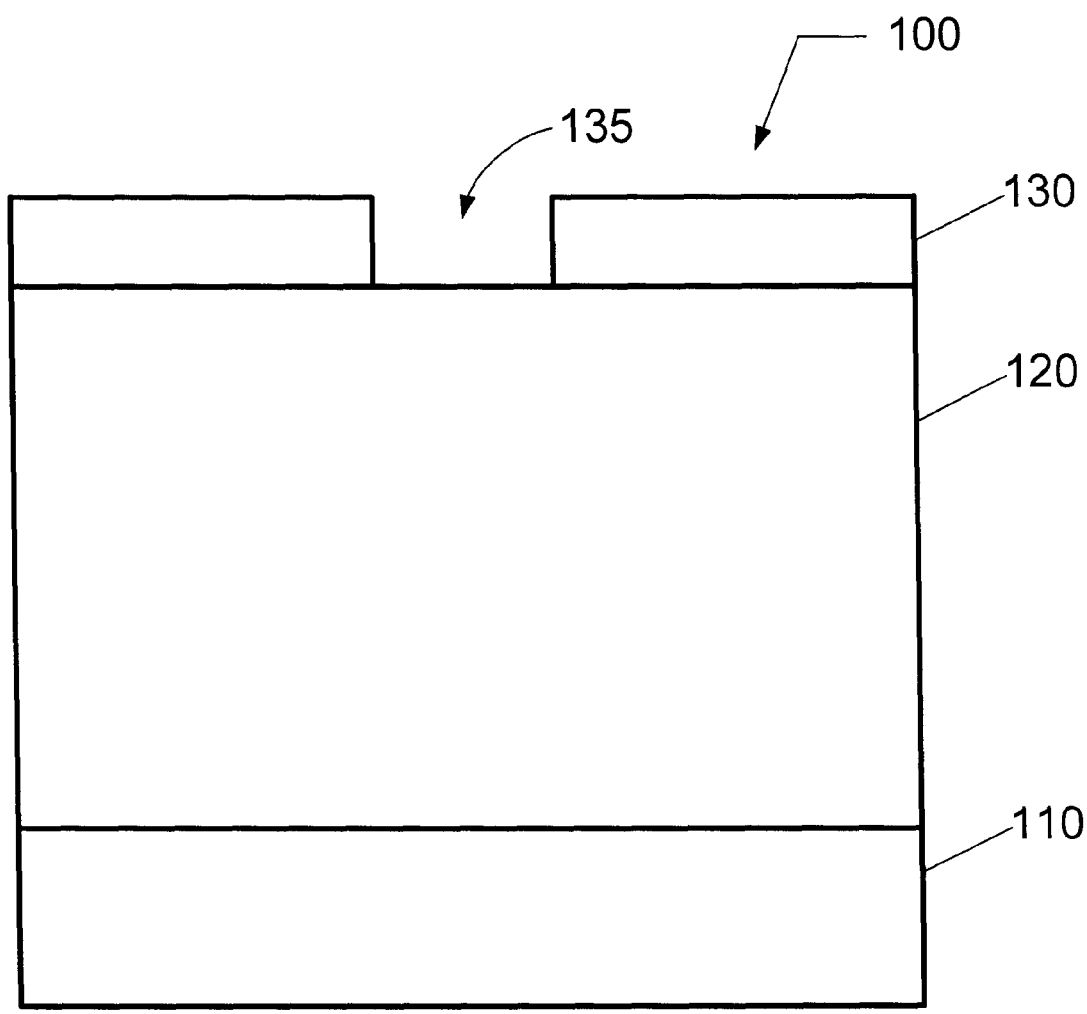
FIGS. 1A and 1B illustrate a schematic representation of the transfer of a pattern to a film stack on a substrate.
Figure 1B:
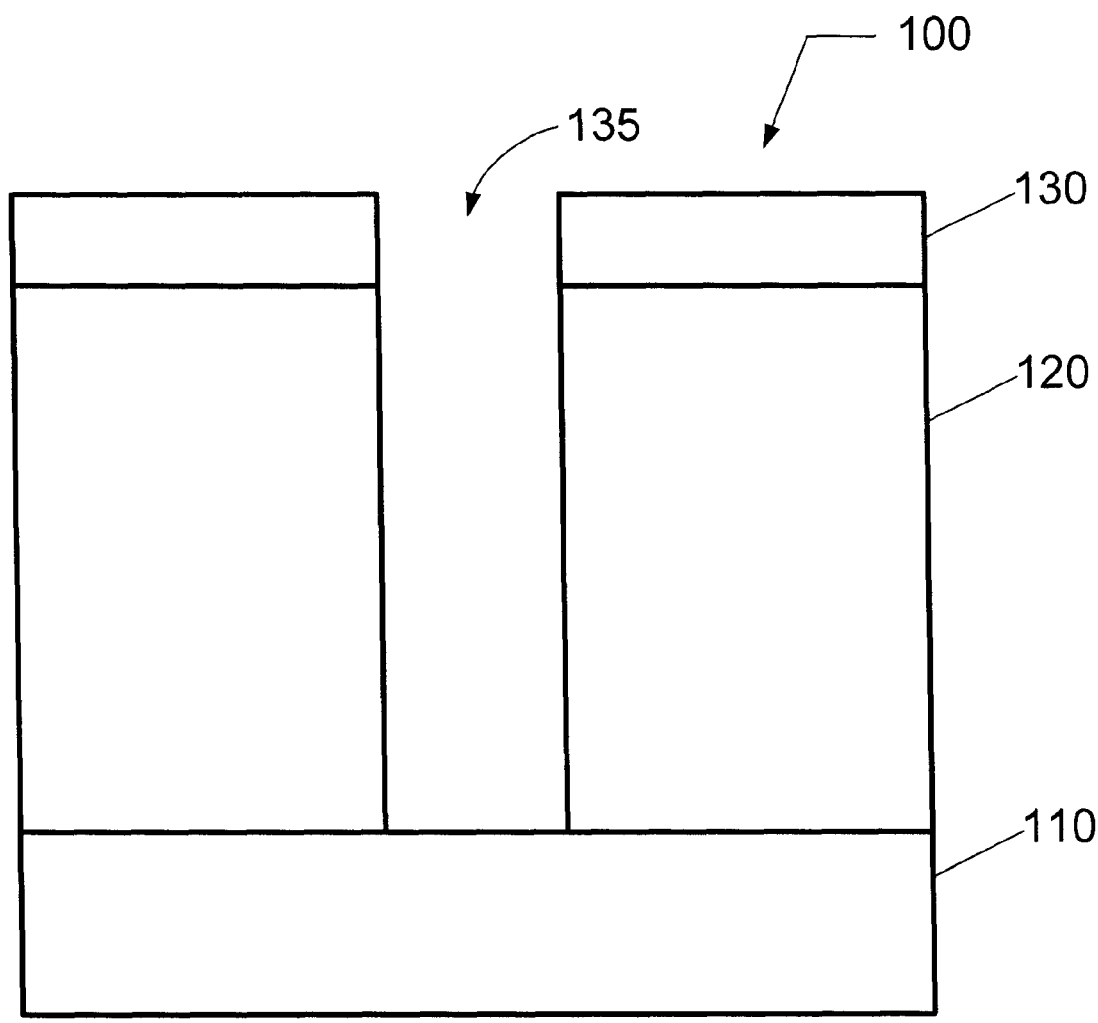
Figure 1C:
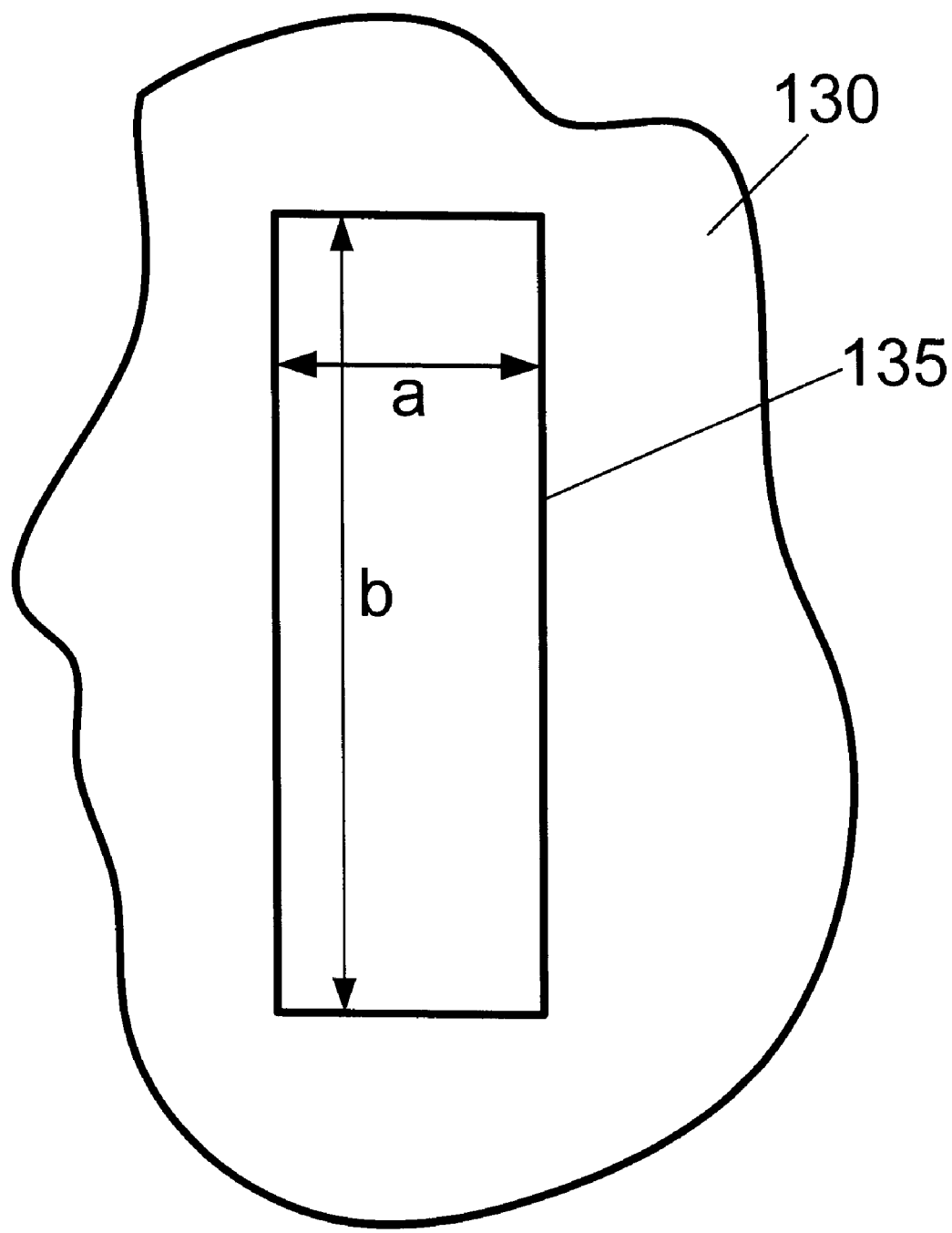
FIG. 1C presents a plan view of the pattern depicted in FIGS. 1A and 1B.

As an example, FIGS. 1A through 1C illustrate a film stack 100 whereby a pattern 135, formed in a mask layer 130, is transferred to an underlying material layer 120 on a substrate 110. The transfer of pattern 135 may be performed using an etching process, such as a dry plasma etching process. Film stack 100 can include transferring a pattern to material layer 120 that may, in turn, serve as a hard mask for preparing a structure in substrate 110. The structure may, for instance, include a deep trench capacitor for use in DRAM memory devices in the electronics industry. As illustrated in the top view provided in FIG. 1C, pattern 135 can be substantially rectangular when forming a deep trench capacitor, and may be characterized by two lateral critical dimensions (CD), namely, a and b (a extending along a minor axis of pattern 135 and b extending along a major axis of pattern 135).

The mask layer 130 may, for instance, comprise a layer of photo-resist having pattern 135 formed via a photo-lithographic process. Furthermore, the mask layer 130 may comprise additional layers, e.g., a bi-layer or tri-layer mask. For instance, mask layer 130 may include a soft mask layer, an anti-reflective coating (ARC), or a hard mask layer, or any combination of two or more thereof. As shown in FIG. 1B, pattern 135 is transferred to the underlying material layer 120 using an etching process, while the CDs, a and b, of pattern 135 can be preserved. In particular, for instance, during the formation of deep trench capacitors, the preservation of the aspect ratio (a/b) for pattern 135 is desirable. However, the inventors have observed that conventional etch processes, configured to transfer pattern 135 into the underlying material layers, may fail to preserve the pattern aspect ratio. For example, an etch process suitable for preserving one CD may not be suitable for preserving another CD, particularly when the aspect ratio (a/b) becomes relatively large.

Referring now to FIGS. 2A through 2D, a method of transferring a pattern to a material layer on a substrate is illustrated according to one embodiment. A film stack 200 is shown, whereby the pattern 135, formed in the mask layer 130, is transferred to a composite material layer 220. The composite material layer 220 comprises material layers 220A, 220B (and optionally 220C) separated by one or more intermediate sub-layers 225A (and optionally 225B) inserted at different levels within the composite layer.

The material composition of material layers 220A, 220B, 220C can be different than the material composition of intermediate sub-layers 225A, 225B. The material composition of each layer may be chosen such that etch processes can be configured to selectively etch one material at a substantially different rate than the other material. For example, when using composite layer 220 to form a structure in a silicon substrate, the material layers 220A, 220B, 220C may comprise oxidized silicon or silicon oxide ($SiO_x$) or silicon dioxide ($SiO_2$), such as various forms of silica, glass, un-doped silicate glass, doped silicate glass, borophosphosilicate glass (BPSG), etc., and the intermediate sub-layers 225A, 225B may comprise silicon nitride ($Si_xN_y$) or nitrides of silicon-containing material or oxynitrides of silicon-containing material. In one example, material layers 220A, 220B, 220C comprise un-doped silicate glass, and intermediate sub-layers 225A, 225B comprise silicon nitride ($Si_3N_4$).

Figure 2A:
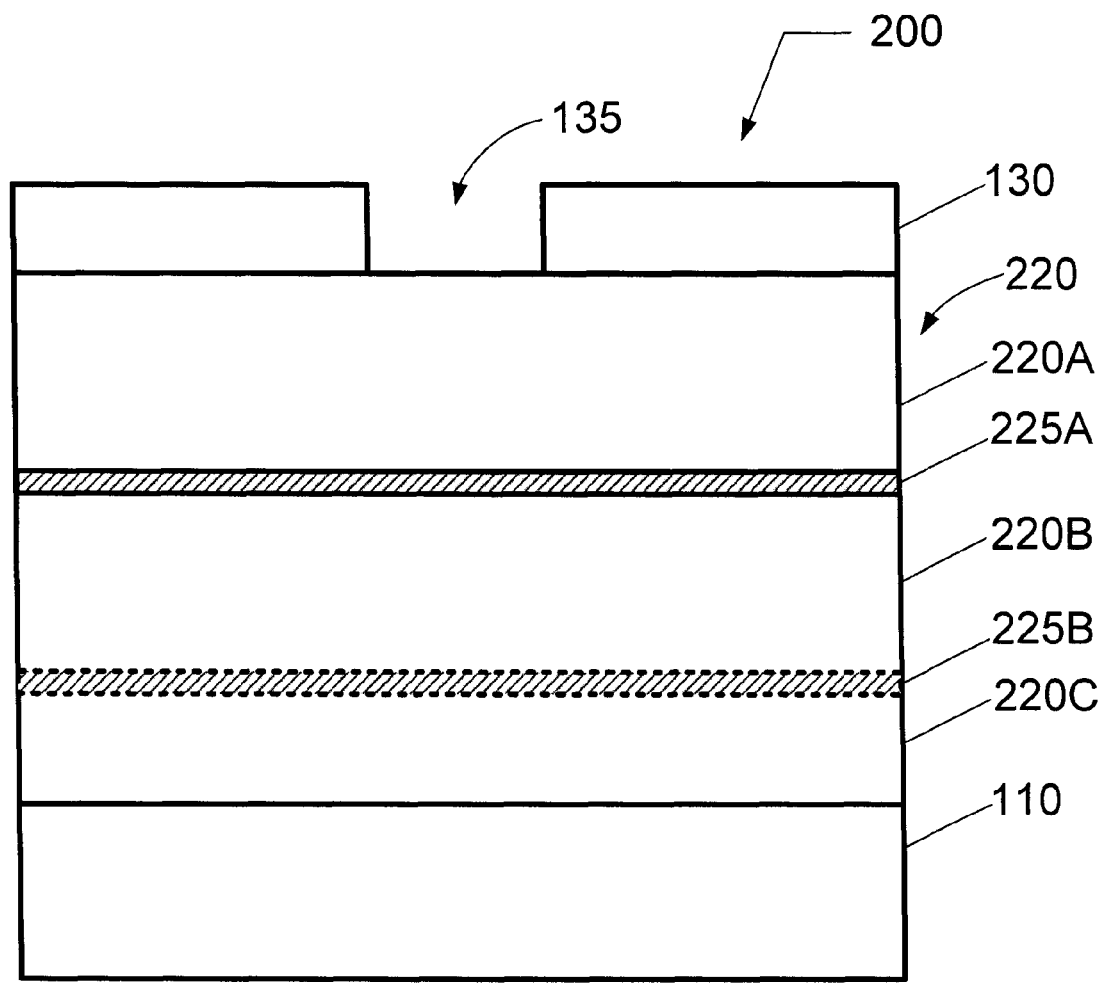
FIGS. 2A through 2D illustrate a schematic representation of the transfer of a pattern to a film stack on a substrate according to an embodiment of the invention.
Figure 2B:
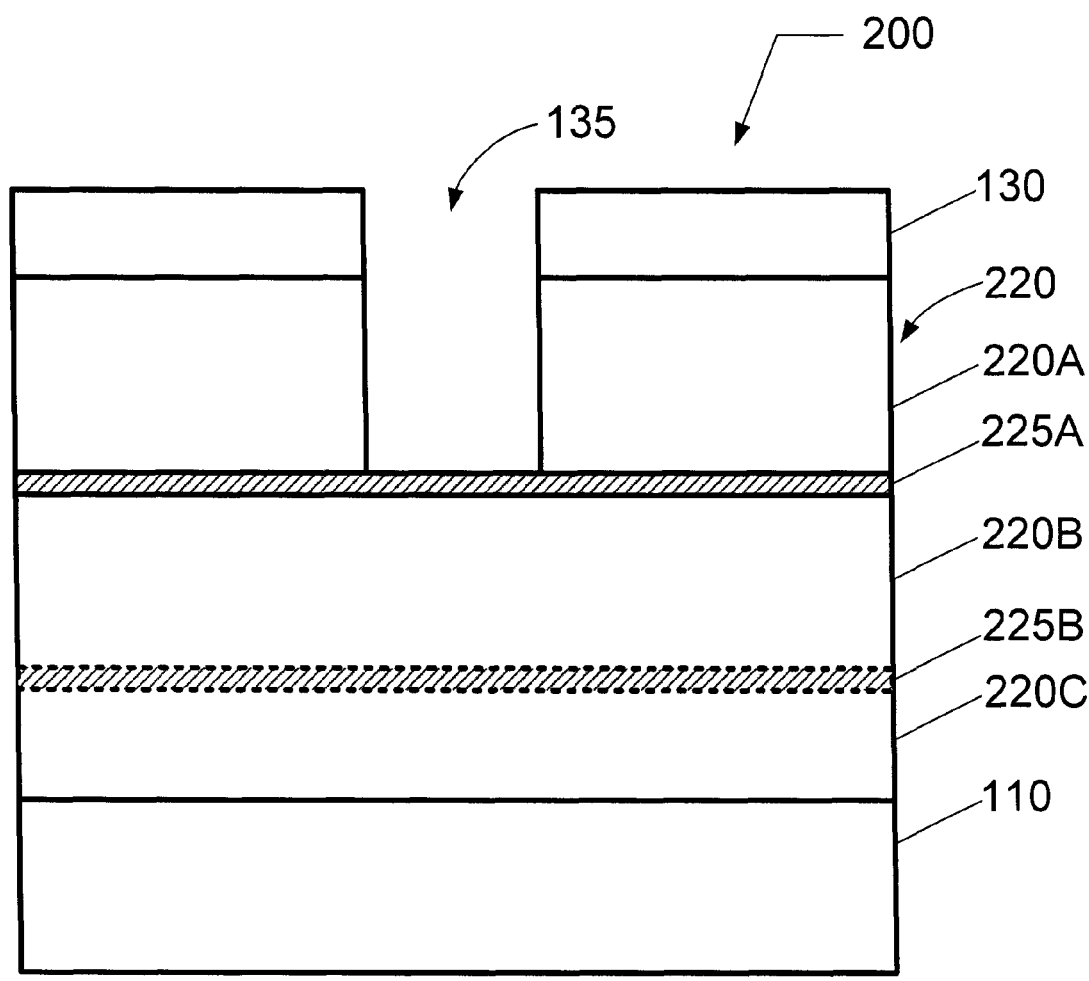

As shown in FIG. 2B, a first etching process is utilized to selectively etch material layer 220A relative to mask layer 130, and stop on intermediate sub-layer 225A. The process chemistry can comprise any etch chemistry configured to etch the materials described above as would be understood by one of skill in the art of etch process engineering. For example, when dry plasma etching an oxide dielectric film such as silicon oxide, silicon dioxide, etc., the plasma etch gas composition generally includes: a fluorocarbon-based chemistry such as $C_4F_8$, $C_5F_8$, $C_3F_6$, $C_4F_6$, $CF_4$, etc. or some combination thereof; or a fluorohydrocarbon-based chemistry such as $CHF_3$, $CH_2F_2$, etc. or some combination thereof; and at least one of an inert gas, oxygen ($O_2$), nitrogen ($N_2$), hydrogen ($H_2$), CO, $CO_2$, NO, $NO_2$, or $N_2O$; or any combination of these gases. Beyond chemistry, dry plasma etching parameters can further include pressure, substrate temperature, chamber component temperature, gas flow rates, power level (for generating and maintaining a plasma density, or ion energy, or both), etc.

Once pattern 135 is transferred to material layer 220A, a corrective etch process is executed in order to adjust at least one CD of pattern 135 in material layer 220A. For example, the CD can include dimension a, dimension b, or aspect ratio a/b, or a combination of two or more thereof. The corrective etch process chemistry can include any combination of etch gas compositions described above. The corrective etch process can be different than the etch processes utilized to etch material layers 220A, 220B, 220C. For instance, the processing parameters, including chemistry, power, pressure, temperature, gas flow rates, etc., may be different.

In general, the time required to transfer pattern 135 to material layer 220A is pre-determined; however, endpoint detection may be utilized to determine when the etch process reaches intermediate layer 225A. As described above, the time is further augmented by a second period of time, or a corrective-etch time period. The corrective-etch time can comprise a fraction of time, such as 1 to 100%, of the first time, and this corrective-etch period can comprise an extension of etching beyond the detection of endpoint. Furthermore, in order to accurately determine the state of pattern 135 in the material layers 220A, 220B, 220C, the profile may be measured to determine whether the CDs and/or the ratio of CDs are within specification before, or after, or before and after the corrective-etch step. One example of a metrology tool for measuring these CDs includes an integrated Optical Digital Profilometry (iODP) scatterometry module.

Figure 2C:
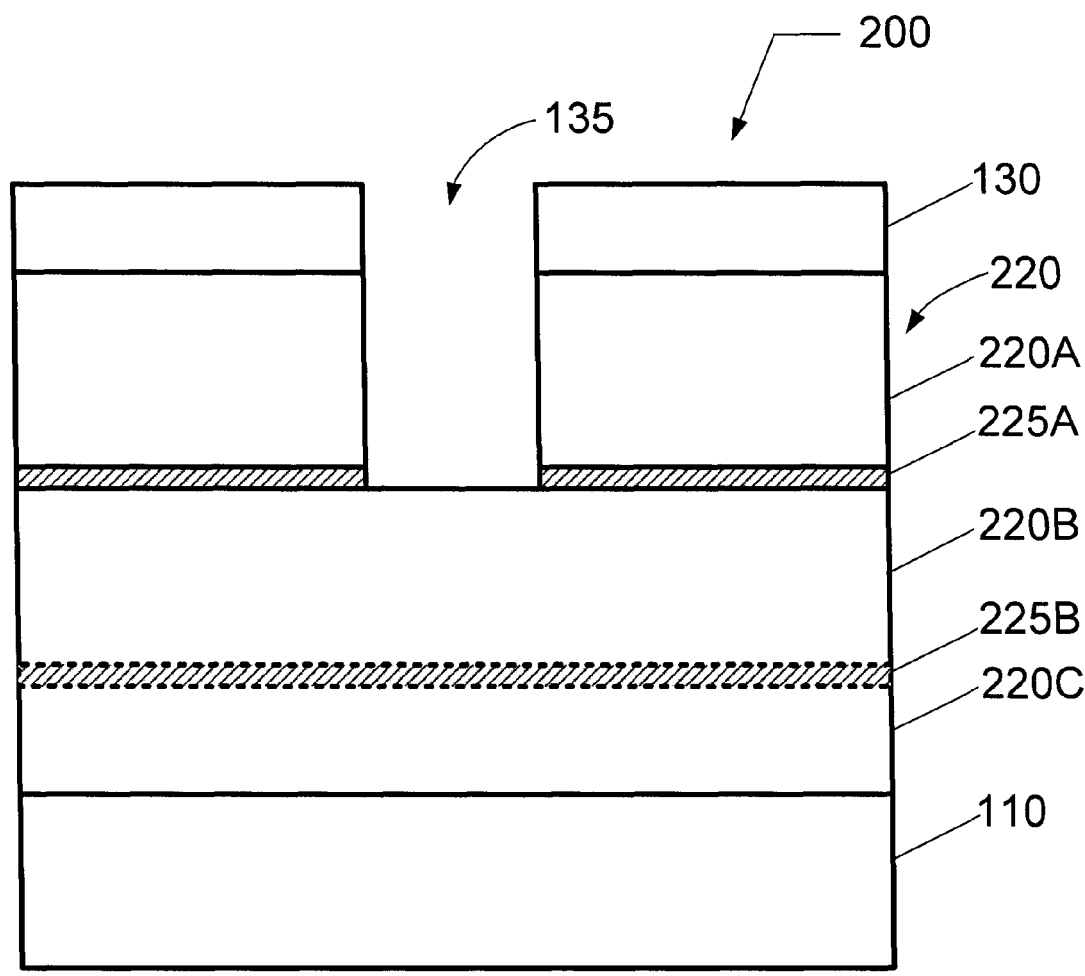

As shown in FIG. 2C, a second etching process is utilized to selectively etch intermediate sub-layer 225A relative to material layer 220A and mask layer 130, and stop on material layer 220B. The process chemistry can comprise any etch chemistry configured to etch the materials described above as would be understood by one of skill in the art of etch process engineering. For example, when dry plasma etching a nitride dielectric film such as silicon nitride, etc., the plasma etch gas composition generally includes: a fluorocarbon-based chemistry such as $C_4F_8$, $C_5F_8$, $C_3F_6$, $C_4F_6$, $CF_4$, etc. or a combination thereof, or a fluorohydrocarbon-based chemistry such as $CHF_3$, $CH_2F_2$, etc., or a combination thereof; and at least one of an inert gas, oxygen ($O_2$), nitrogen ($N_2$), hydrogen ($H_2$), CO, $CO_2$, NO, $NO_2$, or $N_2O$; or any combination of these gases. Beyond chemistry, dry plasma etching parameters can further include pressure, substrate temperature, chamber component temperature, gas flow rates, power level (for generating and maintaining a plasma density, or ion energy, or both), etc.

Figure 2D:
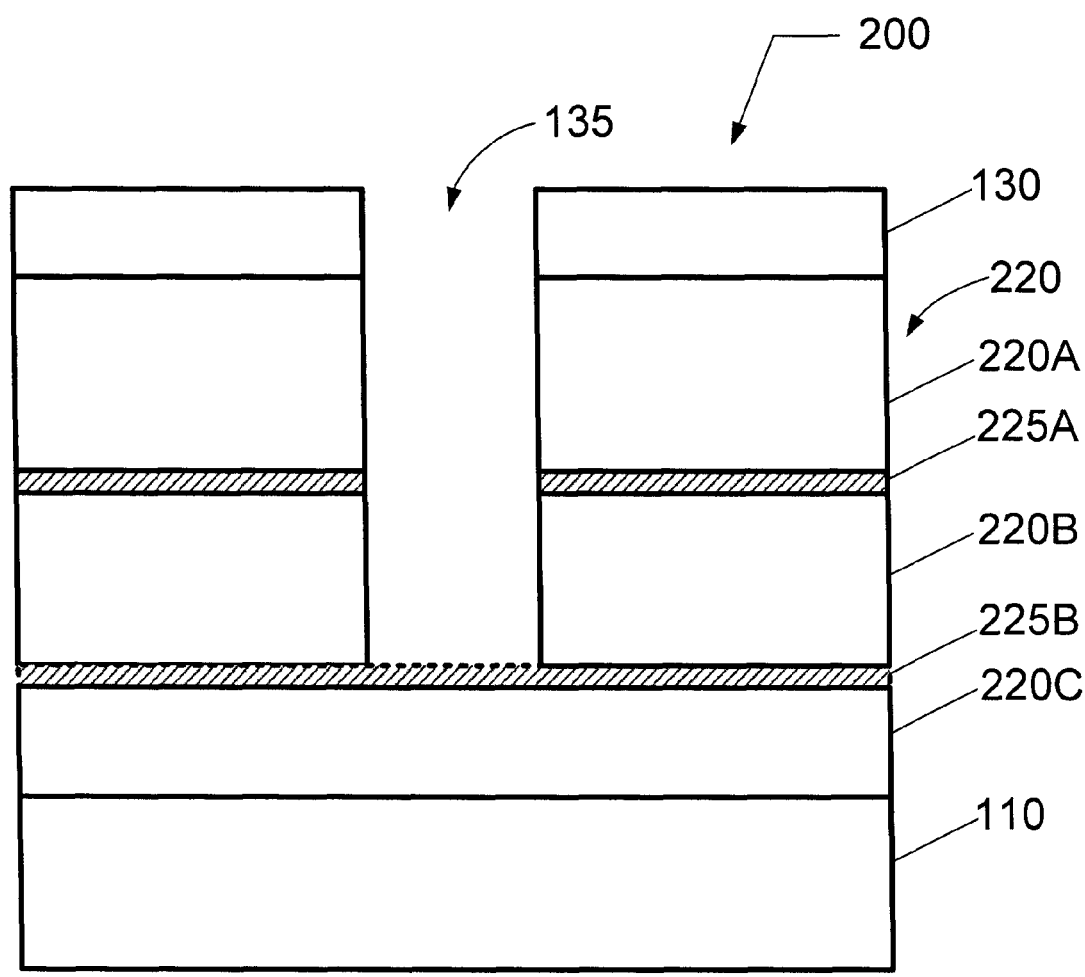

As shown in FIG. 2D, the first and second etching processes, including a corrective etch process following the first etching process, can be repeated for as many material layers and intermediate sub-layers that exist in composite layer 220. Once the substrate 110 is reached a third etching process may be executed to transfer pattern 135 therein. The process chemistry can comprise any etch chemistry configured to etch the materials described above as would be understood by one of skill in the art of etch process engineering. For example, when dry plasma etching a silicon film, the plasma etch gas composition generally includes: a halogen-based chemistry such as HBr, $Cl_2$, $SF_6$, $NF_3$, $SiF_4$, etc. or any combination thereof; and a fluorocarbon-based chemistry such as $C_4F_8$, $C_5F_8$, $C_3F_6$, $C_4F_6$, $CF_4$, etc. or any combination thereof, or a fluorohydrocarbon-based chemistry such as at least one of $CHF_3$, $CH_2F_2$, etc., or a combination thereof; and at least one of an inert gas, oxygen ($O_2$), nitrogen ($N_2$), hydrogen ($H_2$), CO, $CO_2$, NO, $NO_2$, or $N_2O$; or any combination of these gases.

Beyond chemistry, dry plasma etching parameters can further include pressure, substrate temperature, chamber component temperature, gas flow rates, power level (for generating and maintaining a plasma density, or ion energy, or both), etc.

Figure 3A:
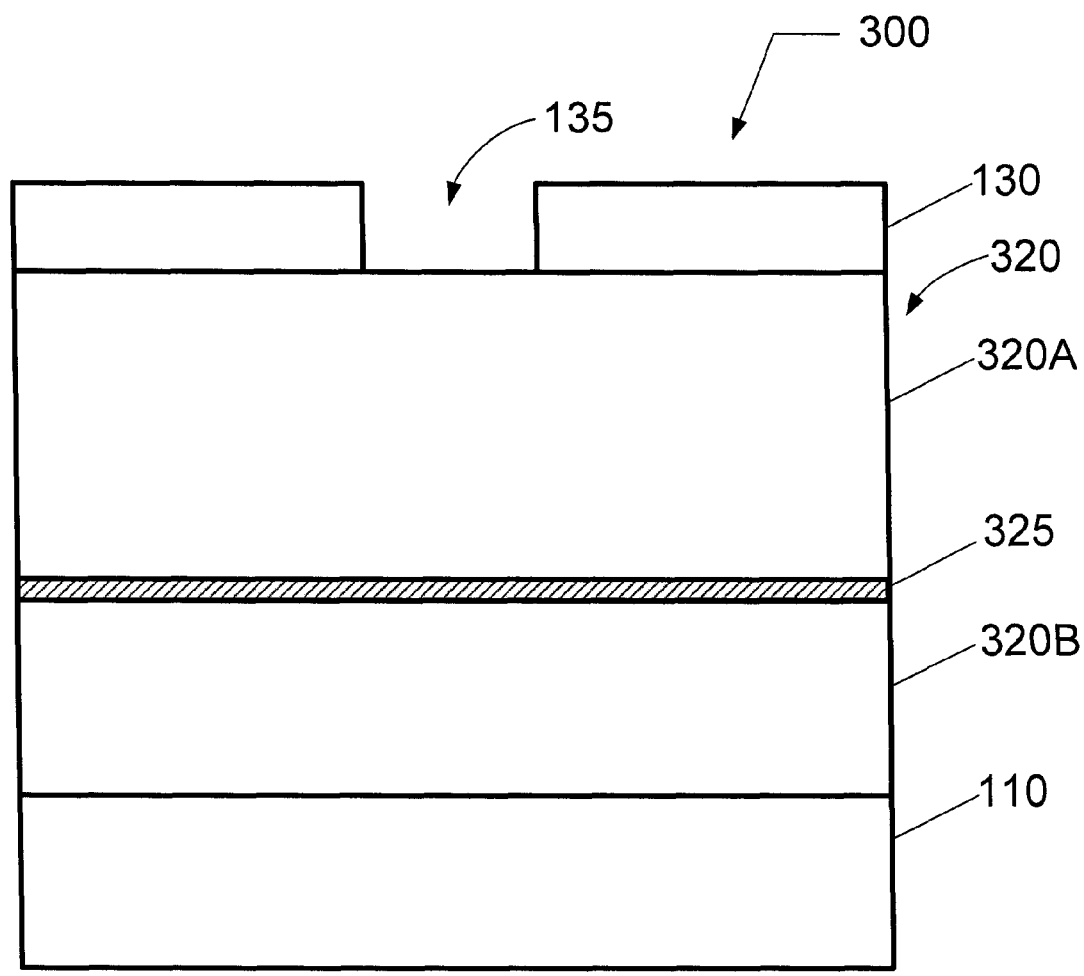
FIGS. 3A through 3C illustrate a schematic representation of the transfer of a pattern to a film stack on a substrate according to another embodiment of the invention.
Figure 3B:
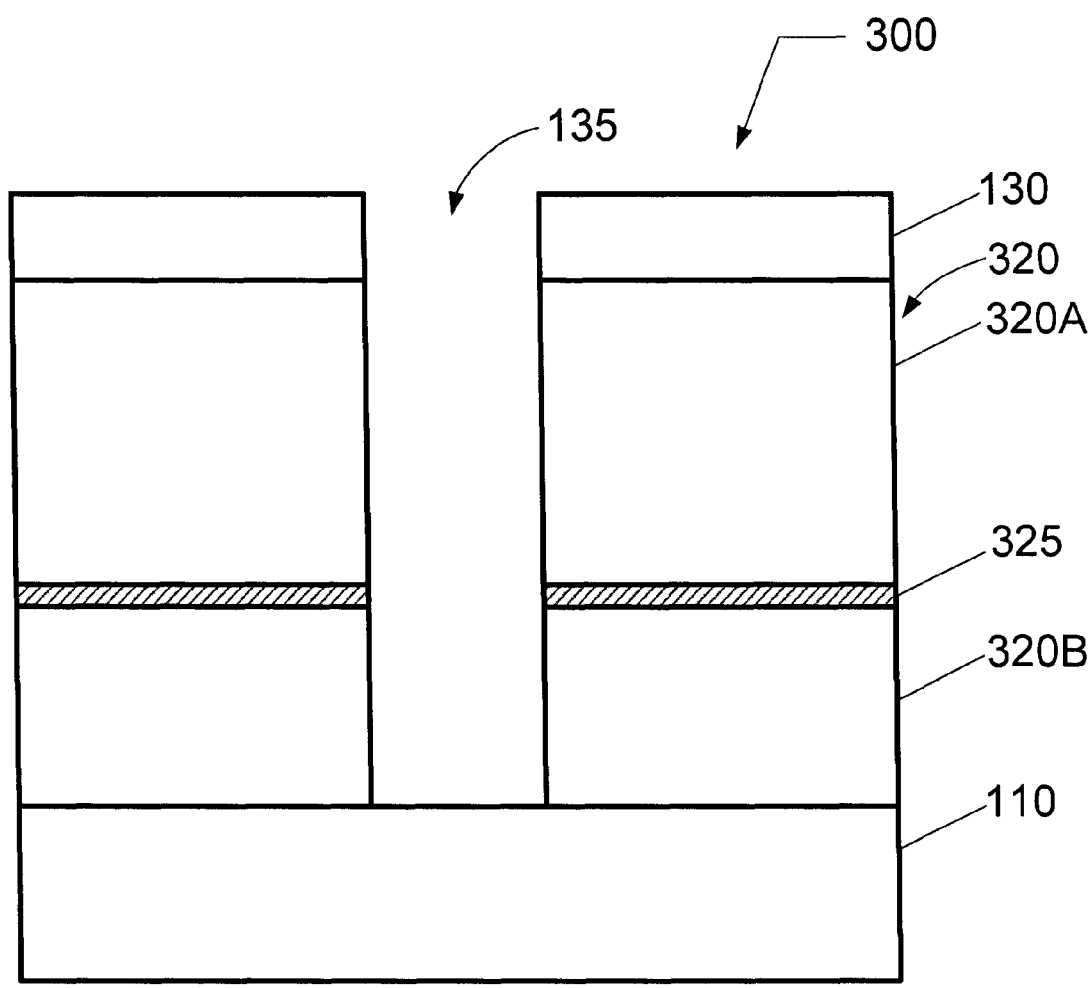
Figure 3C:
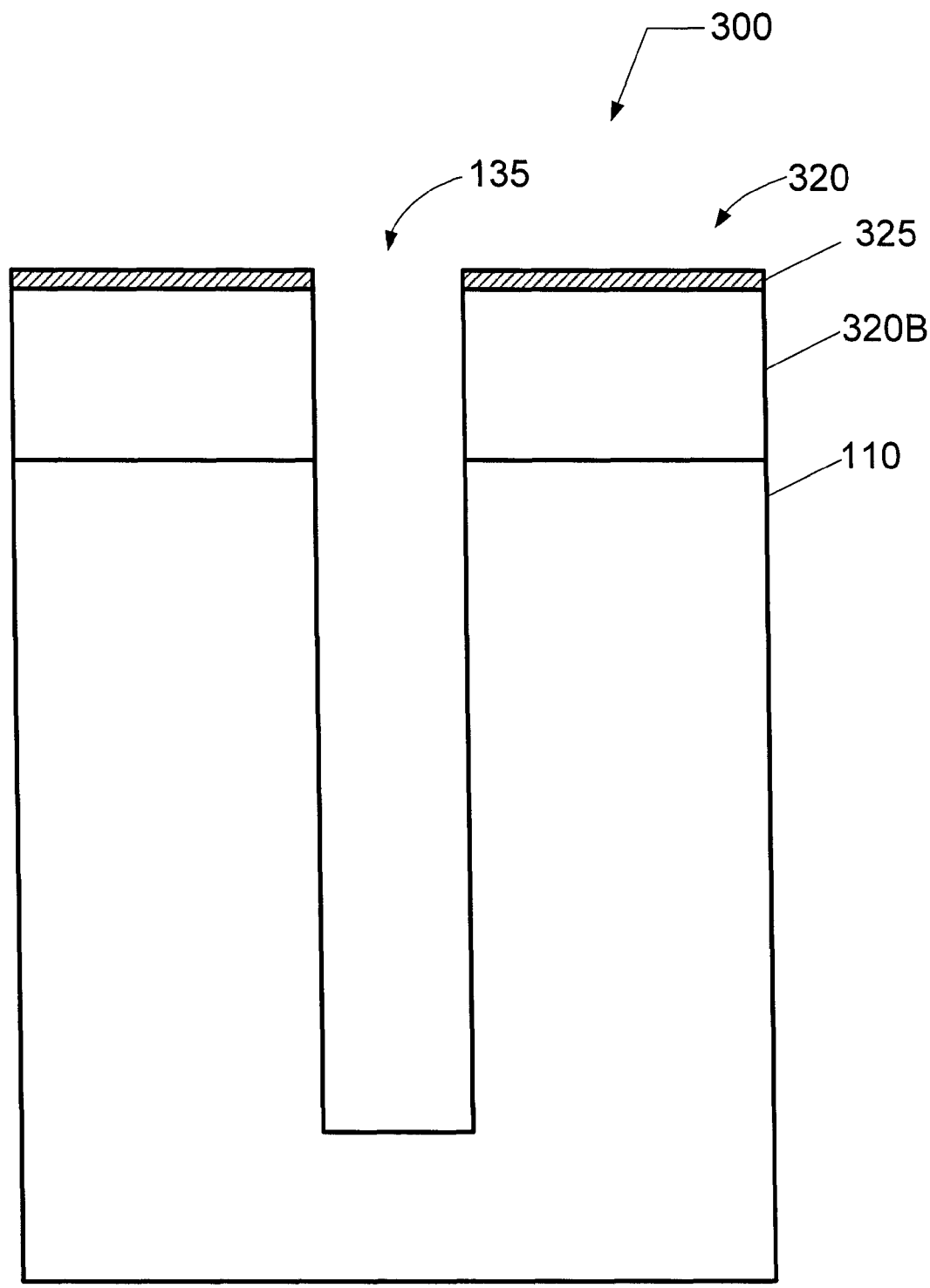

Referring now to FIGS. 3A through 3C, a method of transferring a pattern to a material layer on a substrate is illustrated according to another embodiment. A film stack 300 is shown, whereby the pattern 135, formed in the mask layer 130, is transferred to a composite material layer 320. The composite material layer 320 comprises material layers 320A, 320B separated by an intermediate sub-layer 325 inserted at a specific level within the composite layer.

As shown in FIG. 3B, pattern 135 is transferred to the composite layer 320 using dry etching processes, such as those described above. Once the substrate 110 is reached, mask layer 130 may be consumed during these etching processes; however, it may not be consumed. If not consumed, the mask layer may be stripped prior to etching substrate 110. When etching substrate 110, the placement of intermediate sub-layer 325 within composite layer 320 may be such that it acts as an etch stop layer signaling the completion of the etching process within substrate 110. For example, as the composite layer 320, which is acting as a hard mask for the etching of substrate 110, is consumed, the time it takes to reach the intermediate sub-layer 325 that is acting as an etch stop layer is substantially equivalent to the time required to complete the etching process in substrate 110. Additionally, for example, since the intermediate sub-layer 325 may be of a material composition different than the upper and lower layers of composite layer 320, then endpoint detection, such as optical endpoint detection (e.g., optical emission spectroscopy (OES)), may be utilized to signal the completion of the substrate etching process.

Figure 4:
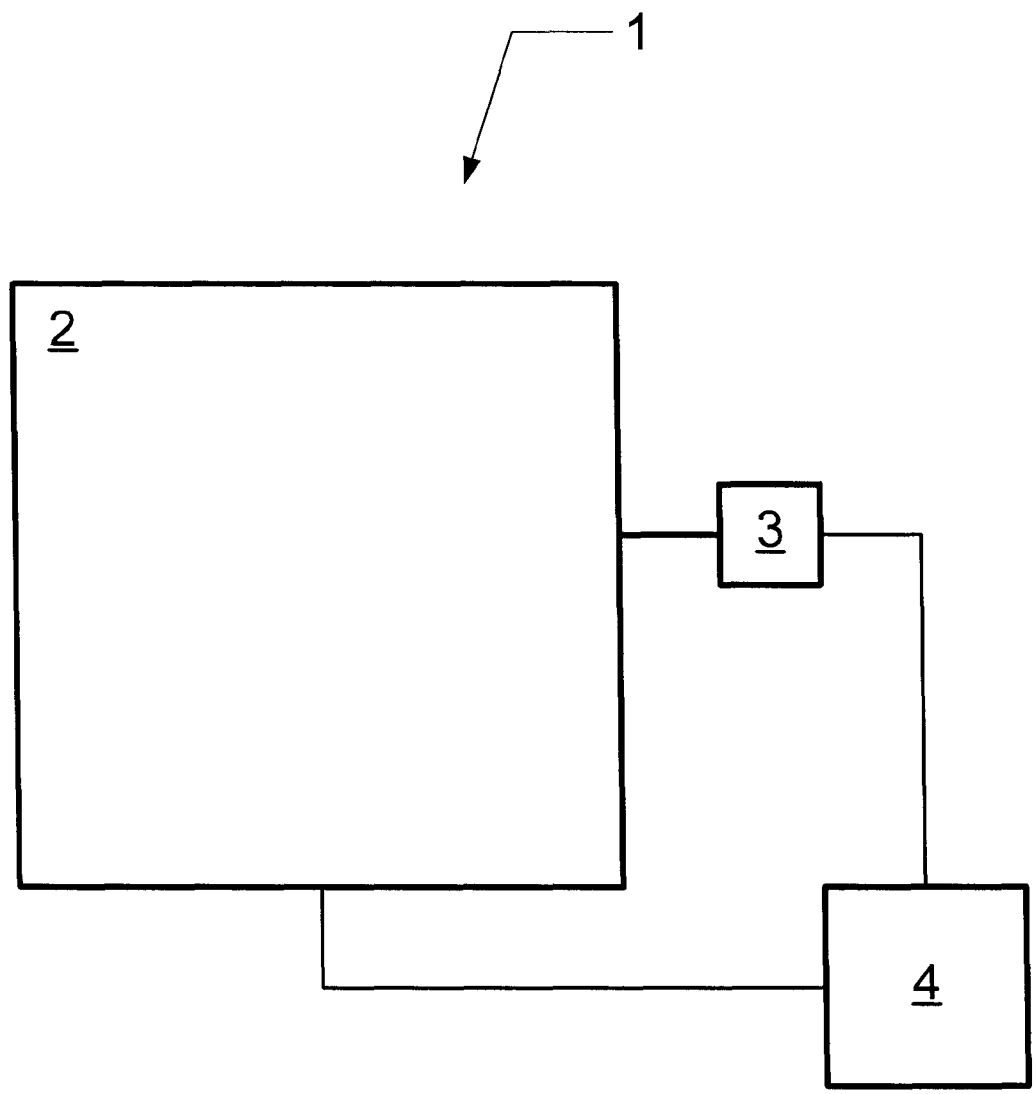
FIG. 4 shows a schematic diagram of a plasma processing system according to an embodiment of the invention.

According to another embodiment, a plasma processing system 1 is depicted in FIG. 4 comprising a plasma processing chamber 2, a diagnostic system 3 coupled to the plasma processing chamber 2, and a controller 4 coupled to the diagnostic system 3 and the plasma processing chamber 2. The controller 4 is configured to execute a process recipe comprising at least one of the above-identified etching chemistries to etch various layers on a substrate. Additionally, controller 4 is configured to receive at least one diagnostic signal from diagnostic system 3 and to post-process the at least one diagnostic signal in order to accurately determine a property of the etching process(es). The diagnostic signal may comprise an endpoint signal, or a metrology signal, or combination thereof. For example, the endpoint signal may indicate the completion of a specific etch process. Additionally, for example, the metrology signal may provide data indicating the state of etch processes performed on the substrate (e.g., profile data for a feature, structure, deep trench, etc.). For instance, diagnostic system 3 may include an optical emission spectrometry system for etch process endpoint detection and a metrology system having a scatterometer, incorporating beam profile ellipsometry (ellipsometer) and beam profile reflectometry (reflectometer), for pattern profile determination. In the illustrated embodiment, plasma processing system 1, depicted in FIG. 4, utilizes plasma for material processing. Plasma processing system 1 can comprise an etch chamber.

Figure 5:
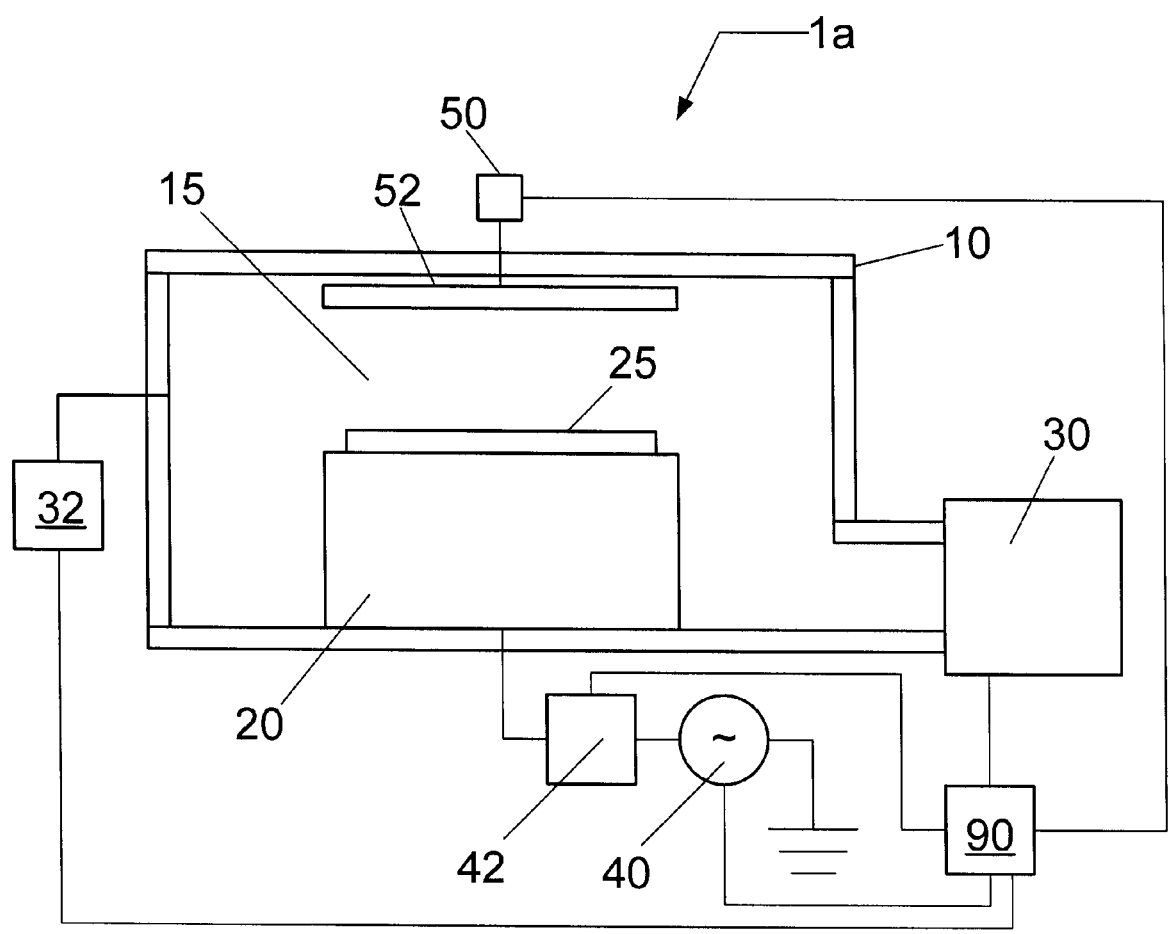
FIG. 5 shows a schematic diagram of a plasma processing system according to another embodiment of the invention.

FIG. 5 illustrates a plasma processing system according to another embodiment. Plasma processing system 1a comprises a plasma processing chamber 10, substrate holder 20, upon which a substrate 25 to be processed is affixed, and vacuum pumping system 30. Substrate 25 can be a semiconductor substrate, a wafer or a liquid crystal display. Plasma processing chamber 10 can be configured to facilitate the generation of plasma in processing region 15 adjacent a surface of substrate 25. An ionizable gas or mixture of gases is introduced via a gas injection system (not shown) and the process pressure is adjusted. For example, a control mechanism (not shown) can be used to throttle the vacuum pumping system 30. Plasma can be utilized to create materials specific to a pre-determined materials process, and/or to aid the removal of material from the exposed surfaces of substrate 25. The plasma processing system 1a can be configured to process a substrate of any size, such as 200 mm substrates, 300 mm substrates, or larger.

Substrate 25 can be affixed to the substrate holder 20 via an electrostatic clamping system. Furthermore, substrate holder 20 can further include a cooling system or heating system that includes a re-circulating fluid flow that receives heat from substrate holder 20 and transfers heat to a heat exchanger system (not shown) when cooling, or transfers heat from the heat exchanger system to the fluid flow when heating. Moreover, gas can be delivered to the back-side of substrate 25 via a backside gas system to improve the gas-gap thermal conductance between substrate 25 and substrate holder 20. Such a system can be utilized when temperature control of the substrate is required at elevated or reduced temperatures. For example, the backside gas system can comprise a two-zone gas distribution system, wherein the backside gas (e.g., helium) pressure can be independently varied between the center and the edge of substrate 25. In other embodiments, heating/cooling elements, such as resistive heating elements, or thermoelectric heaters/coolers can be included in the substrate holder 20, as well as the chamber wall of the plasma processing chamber 10 and any other component within the plasma processing system 1a.

In the embodiment shown in FIG. 5, substrate holder 20 can comprise an electrode through which RF power is coupled to the processing plasma in process space 15. For example, substrate holder 20 can be electrically biased at a RF voltage via the transmission of RF power from a RF generator 40 through an optional impedance match network 42 to substrate holder 20. The RF bias can serve to heat electrons to form and maintain plasma, or affect the ion energy distribution function within the sheath, or both. In this configuration, the system can operate as a reactive ion etch (RIE) reactor, wherein the chamber and an upper gas injection electrode serve as ground surfaces. A typical frequency for the RF bias can range from 0.1 MHz to 100 MHz. RF systems for plasma processing are well known to those skilled in the art.

Furthermore, impedance match network 42 serves to improve the transfer of RF power to plasma in plasma processing chamber 10 by reducing the reflected power. Match network topologies (e.g. L-type, π-type, T-type, etc.) and automatic control methods are well known to those skilled in the art.

Referring still to FIG. 5, plasma processing system 1a further comprises an optional direct current (DC) power supply 50 coupled to an upper electrode 52 opposing substrate 25. The upper electrode 52 may comprise an electrode plate. The electrode plate may comprise a silicon-containing electrode plate. Moreover, the electrode plate may comprise a doped silicon electrode plate. The DC power supply can include a variable DC power supply. Additionally, the DC power supply can include a bipolar DC power supply. The DC power supply 50 can further include a system configured to perform at least one of monitoring adjusting, or controlling the polarity, current, voltage, or on/off state of the DC power supply 50. Once plasma is formed, the DC power supply 50 facilitates the formation of a ballistic electron beam. An electrical filter may be utilized to de-couple RF power from the DC power supply 50.

For example, the DC voltage applied to upper electrode 52 by DC power supply 50 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 52. The surface of the upper electrode 52 facing the substrate holder 20 may be comprised of a silicon-containing material.

The introduction of process gas to plasma processing system 1a may be performed through upper electrode 52. Upper electrode 52 may be configured as a showerhead gas distribution system, wherein process gas is introduced to process space 15 through a plurality of gas injection orifices. The gas distribution system may include a multi-zone gas distribution, wherein, for example, the flow rate of process gas to a center region of substrate 25 may be different the flow rate of process gas to an edge region of substrate 25.

Furthermore, the amplitude of the RF power coupled to substrate holder 20 can be modulated in order to affect changes in the spatial distribution of the electron beam flux to substrate 25. Additional details can be found in co-pending U.S. patent application Ser. No. 11/495,726, entitled "Method and system for controlling the uniformity of a ballistic electron beam by RF modulation" (Lee Chen & Ping Jiang), filed on Jul. 31, 2006; the entire contents of which are incorporated by reference in their entirety.

Vacuum pumping system 30 can include a turbo-molecular vacuum pump (TMP) capable of a pumping speed up to approximately 5000 liters per second (and greater) and a gate valve for throttling the chamber pressure. In conventional plasma processing devices utilized for dry plasma etch, a 1000 to 3000 liter per second TMP can be employed. TMPs can be used for low pressure processing, typically less than 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 10. The pressure measuring device can be, for example, a Type 628B Baratron absolute capacitance manometer commercially available from MKS Instruments, Inc. (Andover, Mass.).

Referring still to FIG. 5, plasma processing system 1a further comprises a controller 90 that comprises a microprocessor, memory, and a digital I/O port capable of generating control voltages sufficient to communicate and activate inputs to plasma processing system 1a as well as monitor outputs from plasma processing system 1a. Moreover, controller 90 can be coupled to and can exchange information with RF generator 40, impedance match network 42, optional DC power supply 50, the gas injection system (not shown), a diagnostic system 32, vacuum pumping system 30, as well as the backside gas delivery system (not shown), the substrate/substrate holder temperature measurement system (not shown), and/or the electrostatic clamping system (not shown). A program stored in the memory can be utilized to activate the inputs to the aforementioned components of plasma processing system 1a according to a process recipe in order to perform the method of etching a thin film. One example of controller 90 is a DELL PRECISION WORKSTATION 610™, available from Dell Corporation, Austin, Tex.

Controller 90 may be locally located relative to the plasma processing system 1a, or it may be remotely located relative to the plasma processing system 1a via an internet or intranet. Thus, controller 90 can exchange data with the plasma processing system 1a using at least one of a direct connection, an intranet, or the internet. Controller 90 may be coupled to an intranet at a customer site (i.e., a device maker, etc.), or coupled to an intranet at a vendor site (i.e., an equipment manufacturer). Furthermore, another computer (i.e., controller, server, etc.) can access controller 90 to exchange data via at least one of a direct connection, an intranet, or the internet.

The diagnostic system 32 can include an optical diagnostic subsystem (not shown). The diagnostic system 32 can be configured to provide an endpoint signal that may indicate the completion of a specific etch process. Additionally, for example, the diagnostic system 32 can be configured to provide a metrology signal that may provide data indicating the state of etch processes performed on the substrate (e.g., profile data for a feature, structure, deep trench, etc.). For instance, diagnostic system 32 may include an optical emission spectrometry system for etch process endpoint detection, or a scatterometer, incorporating beam profile ellipsometry (ellipsometer) and beam profile reflectometry (reflectometer) for pattern profile determination, or both.

The optical diagnostic subsystem can comprise a detector such as a (silicon) photodiode or a photomultiplier tube (PMT) for measuring the light intensity emitted from the plasma. The diagnostic system 32 can further include an optical filter such as a narrow-band interference filter. In an alternate embodiment, the diagnostic system 32 can include a line CCD (charge coupled device), a CID (charge injection device) array, or a light dispersing device such as a grating or a prism. Additionally, diagnostic system 32 can include a monochromator (e.g., grating/detector system) for measuring light at a given wavelength, or a spectrometer (e.g., with a rotating grating) for measuring the light spectrum such as, for example, the device described in U.S. Pat. No. 5,888,337, the contents of which are incorporated herein by reference.

The diagnostic system 32 can include a high resolution Optical Emission Spectroscopy (OES) sensor such as from Peak Sensor Systems, or Verity Instruments, Inc. Such an OES sensor can have a broad spectrum that spans the ultraviolet (UV), visible (VIS), and near infrared (NIR) light spectrums. The resolution can be approximately 1.4 Angstroms, that is, the sensor can be capable of collecting about 5550 wavelengths from about 240 to about 1000 nm. For example, the OES sensor can be equipped with high sensitivity miniature fiber optic UV-VIS-NIR spectrometers which are, in turn, integrated with 2048 pixel linear CCD arrays.

The spectrometers receive light transmitted through single and bundled optical fibers, where the light output from the optical fibers is dispersed across the line CCD array using a fixed grating. Similar to the configuration described above, light passing through an optical vacuum window can be focused onto the input end of the optical fibers via a convex spherical lens. Three spectrometers, each specifically tuned for a given spectral range (UV, VIS and NIR), form a sensor for a process chamber. Each spectrometer includes an independent A/D converter. And lastly, depending upon the sensor utilization, a full emission spectrum can be recorded every 0.1 to 1.0 seconds.

The diagnostic system 32 can include a metrology system that may be either an in-situ or ex-situ device. For example, the metrology system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035), which is positioned within a transfer chamber (not shown) to analyze substrates. For instance, the metrology system may include an integrated optical digital profile (iODP) scatterometry system.

In the embodiment shown in FIG. 6, the plasma processing system 1b can be similar to the embodiment of FIG. 4 or 5 and further comprise either a stationary, or mechanically or electrically rotating magnetic field system 60, in order to potentially increase plasma density and/or improve plasma processing uniformity, in addition to those components described with reference to FIG. 4. Moreover, controller 90 can be coupled to magnetic field system 60 in order to regulate the speed of rotation and field strength. The design and implementation of a rotating magnetic field is well known to those skilled in the art.

Figure 7:
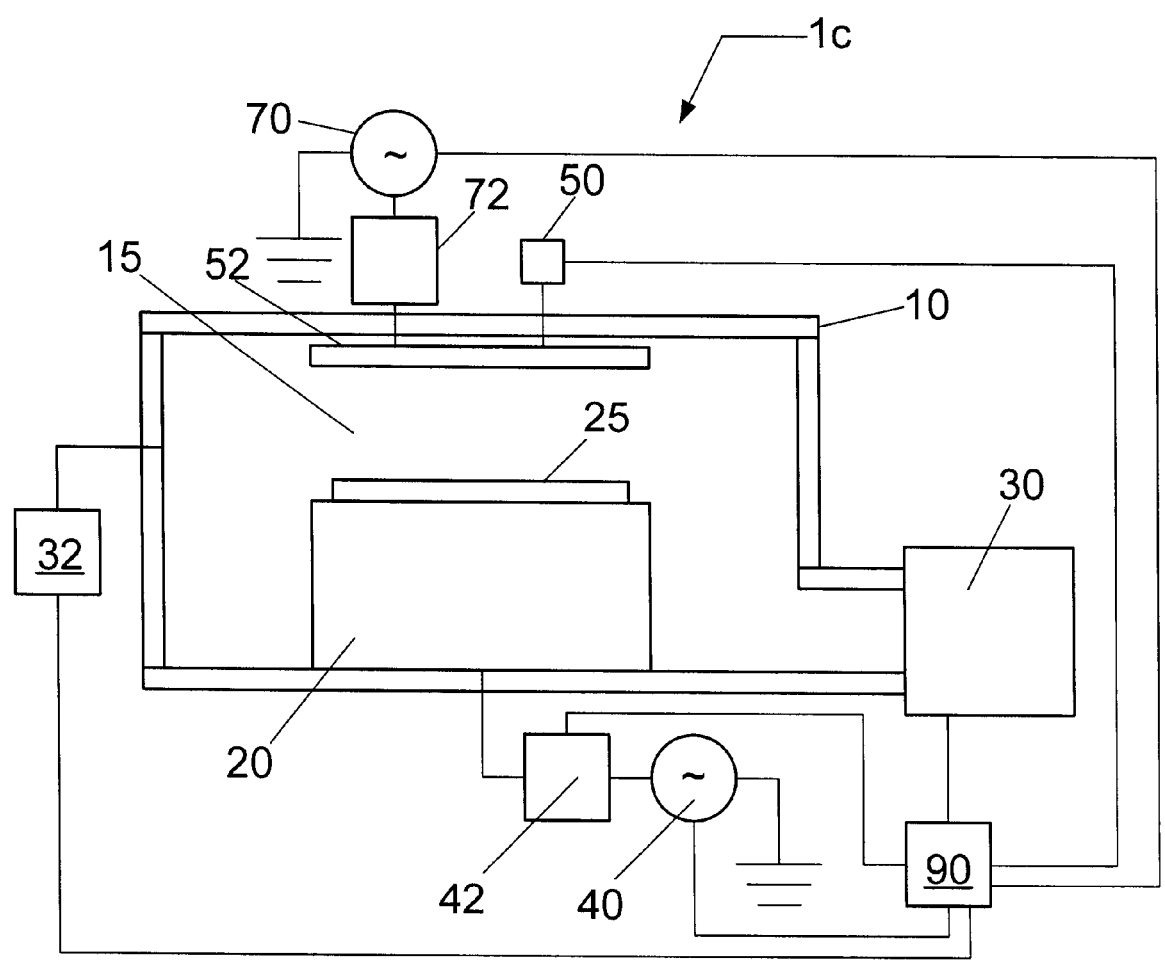
FIG. 7 shows a schematic diagram of a plasma processing system according to another embodiment of the invention.

In the embodiment shown in FIG. 7, the plasma processing system 1c can be similar to the embodiment of FIG. 4 or FIG. 5, and can further comprise an RF generator 70 configured to couple RF power to upper electrode 52 through an optional impedance match network 72. A typical frequency for the application of RF power to upper electrode 52 can range from about 0.1 MHz to about 200 MHz. Additionally, a typical frequency for the application of power to the substrate holder 20 (or lower electrode) can range from about 0.1 MHz to about 100 MHz. For example, the RF frequency coupled to the upper electrode 52 can be relatively higher than the RF frequency coupled to the substrate holder 20. Optionally, the RF power to the upper electrode 52 from RF generator 70 can be amplitude modulated, or the RF power to the substrate holder 20 from RF generator 40 can be amplitude modulated, or both RF powers can be amplitude modulated. The RF power at the higher RF frequency can be amplitude modulated. Moreover, controller 90 is coupled to RF generator 70 and impedance match network 72 in order to control the application of RF power to upper electrode 70. The design and implementation of an upper electrode is well known to those skilled in the art.

Referring still to FIG. 7, the optional DC power supply 50 may be directly coupled to upper electrode 52, or it may be coupled to the RF transmission line extending from an output end of impedance match network 72 to upper electrode 52. An electrical filter may be utilized to de-couple RF power from DC power supply 50.

Figure 6:
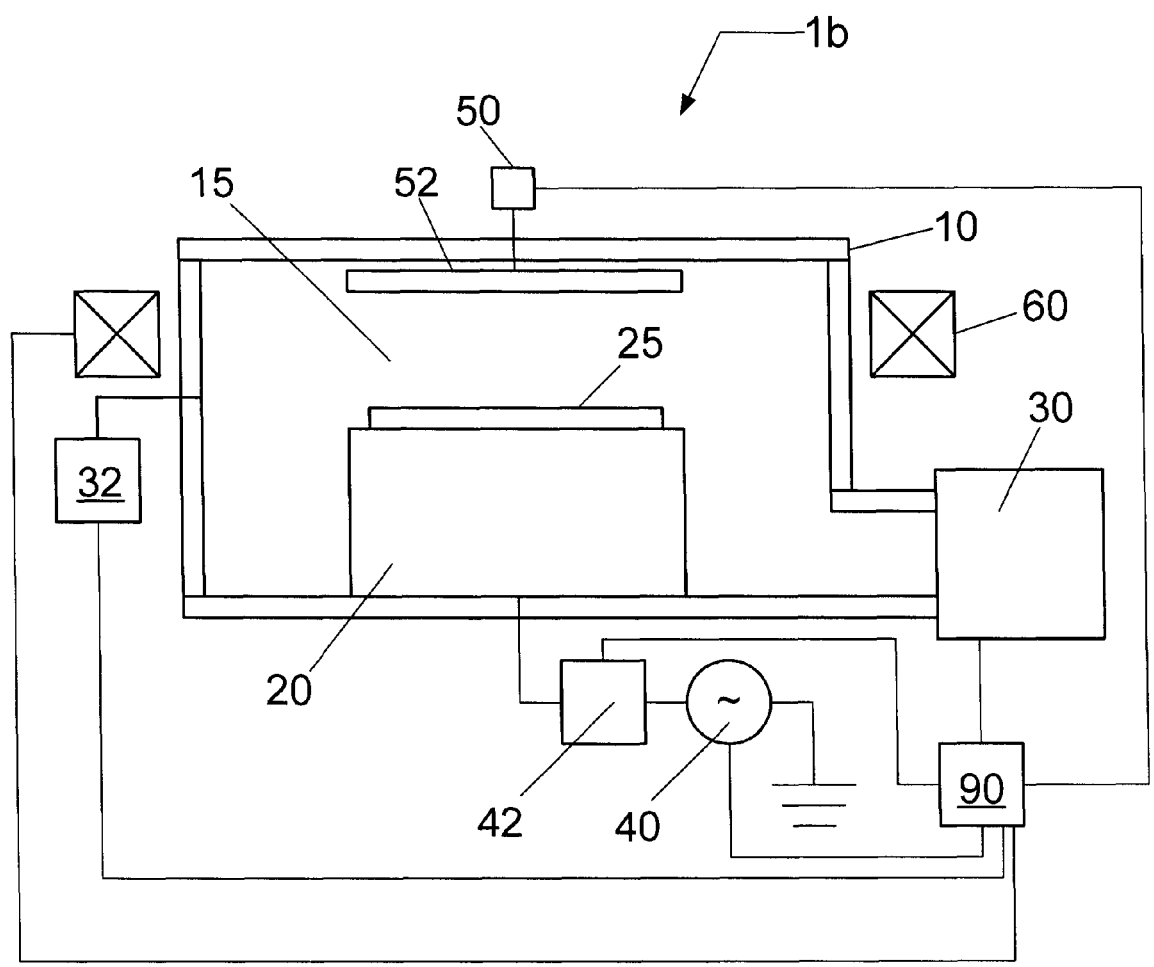
FIG. 6 shows a schematic diagram of a plasma processing system according to another embodiment of the invention.
Figure 8:
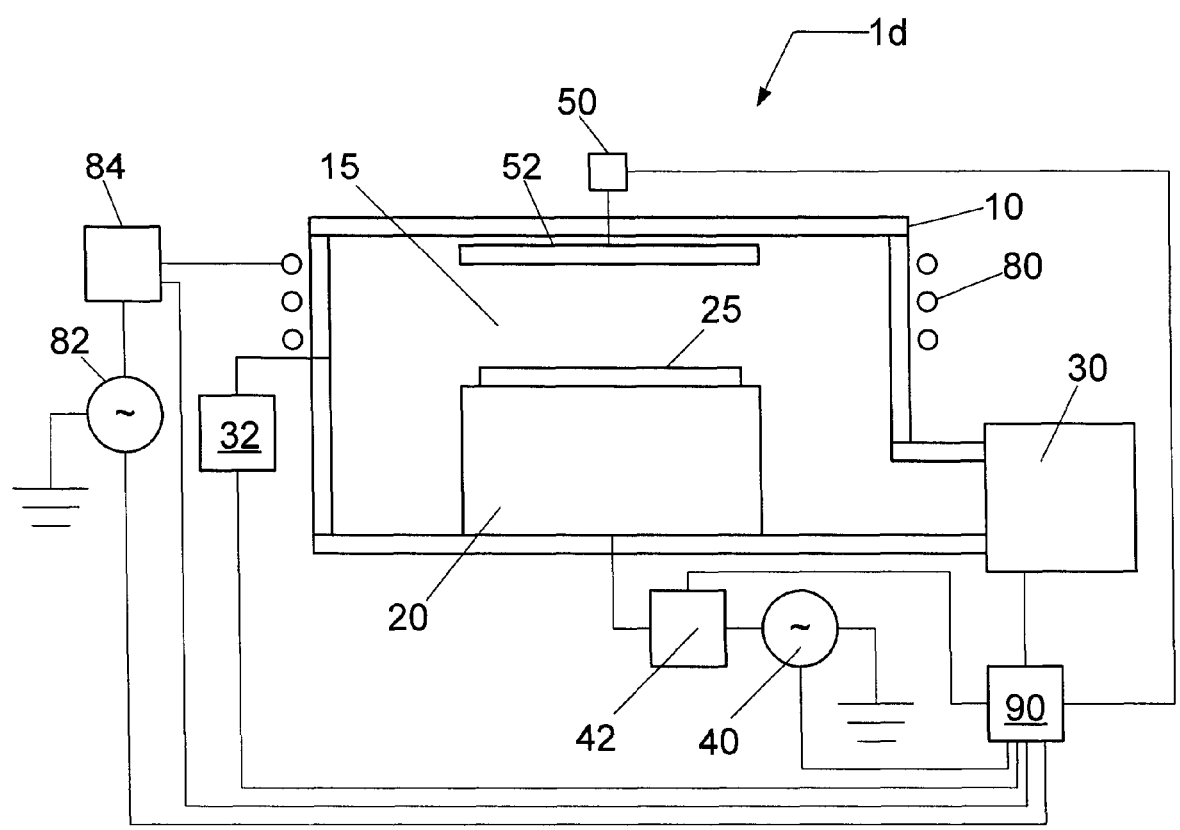
FIG. 8 shows a schematic diagram of a plasma processing system according to another embodiment of the invention.

In the embodiment shown in FIG. 8, the plasma processing system 1d can, for example, be similar to the embodiments of FIGS. 4, 5 and 6, and can further comprise an inductive coil 80 to which RF power is coupled via RF generator 82 through an optional impedance match network 84. RF power is inductively coupled from inductive coil 80 through a dielectric window (not shown) to plasma processing region 15. A typical frequency for the application of RF power to the inductive coil 80 can range from about 10 MHz to about 100 MHz. Similarly, a typical frequency for the application of power to the chuck electrode can range from about 0.1 MHz to about 100 MHz. In addition, a slotted Faraday shield (not shown) can be employed to reduce capacitive coupling between the inductive coil 80 and plasma. Moreover, controller 90 is coupled to RF generator 82 and impedance match network 84 in order to control the application of power to inductive coil 80. In an alternate embodiment, inductive coil 80 can be a "spiral" coil or "pancake" coil in communication with the plasma processing region 15 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 9:
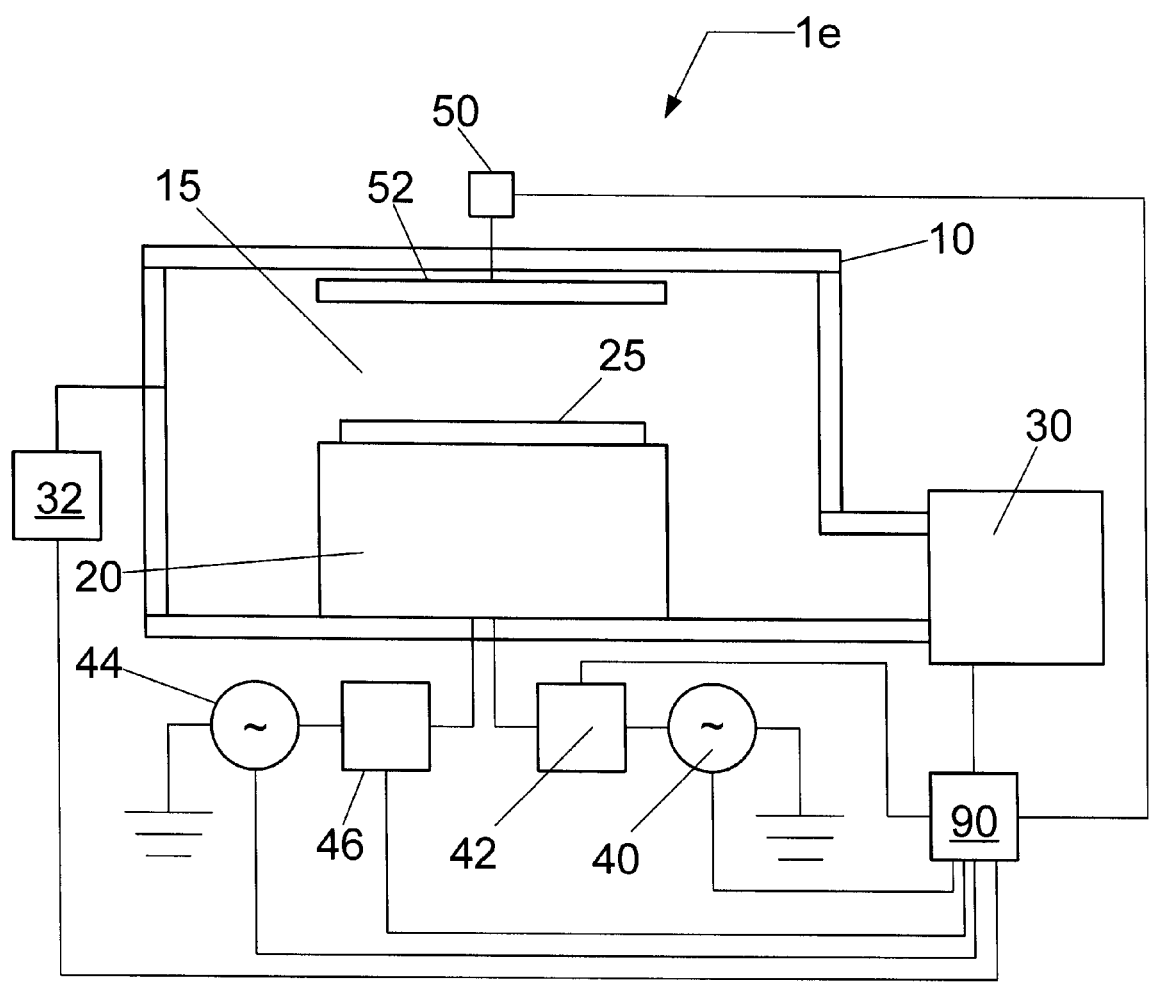
FIG. 9 shows a schematic diagram of a plasma processing system according to another embodiment of the invention.

In the embodiment shown in FIG. 9, the plasma processing system 1e can, for example, be similar to the embodiments of FIGS. 4, 5 and 6, and can further comprise a second RF generator 44 configured to couple RF power to substrate holder 20 through another optional impedance match network 46. A typical frequency for the application of RF power to substrate holder 20 can range from about 0.1 MHz to about 200 MHz for either the first RF generator 40 or the second RF generator 44 or both. The RF frequency for the second RF generator 44 can be relatively greater than the RF frequency for the first RF generator 44. Furthermore, the RF power to the substrate holder 20 from RF generator 40 can be amplitude modulated, or the RF power to the substrate holder 20 from RF generator 44 can be amplitude modulated, or both RF powers can be amplitude modulated. The RF power at the higher RF frequency can be amplitude modulated. Moreover, controller 90 is coupled to the second RF generator 44 and impedance match network 46 in order to control the application of RF power to substrate holder 20. The design and implementation of an RF system for a substrate holder is well known to those skilled in the art.

In the following discussion, a method of etching a thin film utilizing a plasma processing system is presented. For example, the plasma processing system can comprise various elements, such as described in FIGS. 4 through 9, and combinations thereof.

Figure 10:
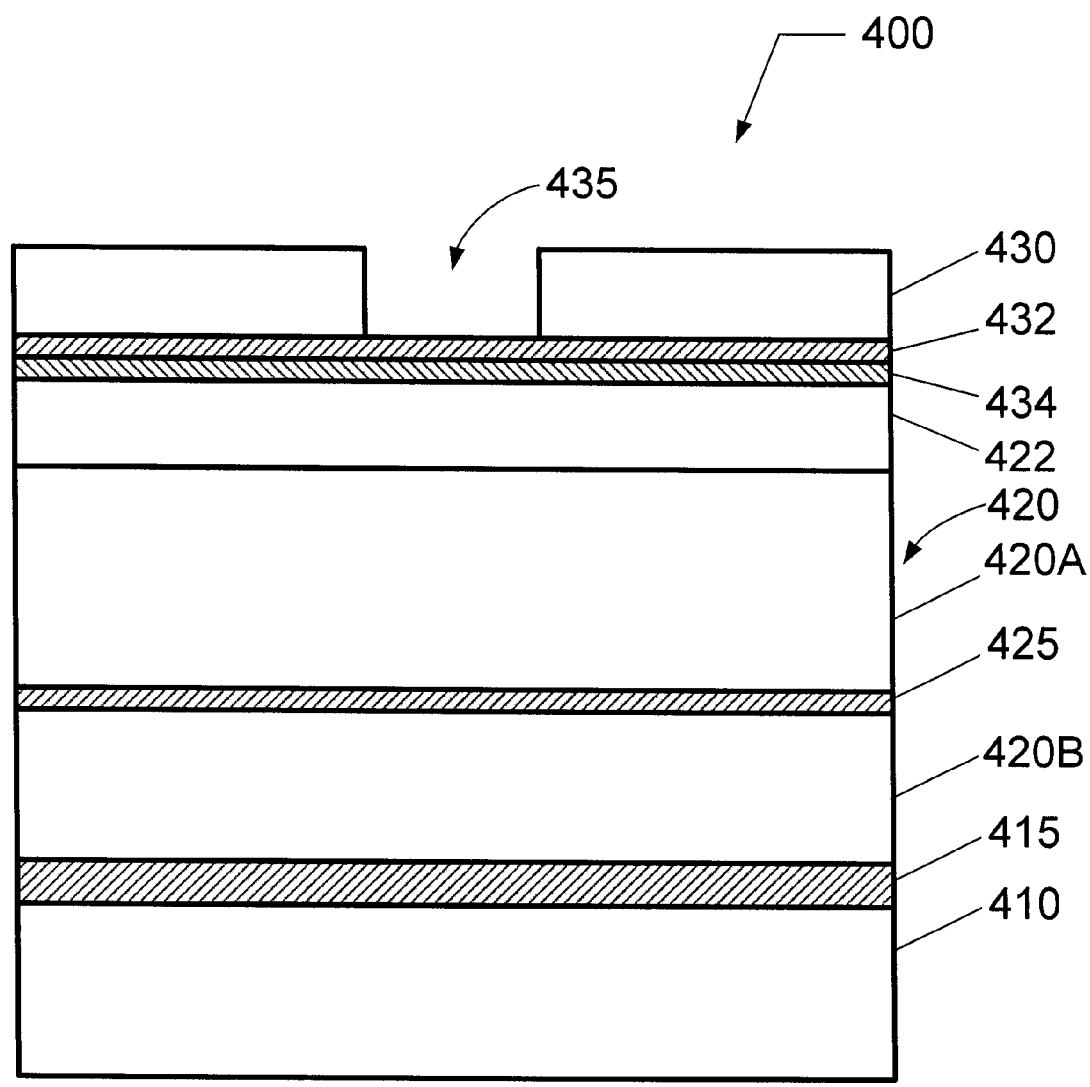
FIG. 10 illustrates an exemplary film stack according to an embodiment of the invention.

Referring now to FIG. 10, an exemplary method for forming a deep trench capacitor in a silicon substrate is illustrated. A film stack 400 is depicted comprising substrate 410, an insulation layer 415 comprising silicon nitride formed on substrate 410, a composite layer 420 formed on the insulation layer 415 having a first material layer 420B comprising un-doped silicate glass, an intermediate sub-layer 425 comprising silicon nitride and a second material layer 420A comprising un-doped silicate glass, a hard mask layer 422 comprising carbon, a silicon oxynitride layer 434 formed on the hard mask layer 422, an anti-reflective coating (ARC) 432 layer formed on the silicon oxynitride layer 434, and a mask layer 430 having lithographic pattern 435 formed on the ARC layer 432.

Pattern 435 is transferred into the underlying film stack 400 using several process steps executed in a plasma processing system such as the one described in FIG. 7. An exemplary process recipe comprising a plurality of process steps for transferring pattern 435 to each layer is described below. However, the methods discussed are not to be limited in scope by this exemplary presentation.

Pattern 435 is transferred to ARC layer 432 and silicon oxynitride layer 434 using the following exemplary process recipe: Chamber pressure=about 100 mTorr; Upper electrode RF power=about 500 W; Lower electrode RF power=about 600 W; Process gas flow rate $CF_4/CHF_3$=about 120/30 sccm; about a 60 mm electrode spacing between the lower surface of electrode 70 (see FIG. 7) and the upper surface of substrate 25 on substrate holder 20; Lower electrode temperature (e.g., substrate holder 20 in FIG. 7)=about 20° C.; Upper electrode temperature (e.g., electrode 70 in FIG. 5)=about 60° C.; Chamber wall temperature=about 60° C.; Backside helium pressure Center/Edge=about 10/35 Torr; and an etch time of approximately 60 to 120 seconds.

Pattern 435 is transferred to hard mask layer 422 using the following exemplary process recipe: Chamber pressure=about 10 mTorr; Upper electrode RF power=about 1000 W; Lower electrode RF power=about 300 W; Process gas flow rate CO/O$_2$=about 300/30 sccm; about a 60 mm electrode spacing between the lower surface of electrode 70 (see FIG. 7) and the upper surface of substrate 25 on substrate holder 20; Lower electrode temperature (e.g., substrate holder 20 in FIG. 7)=about 20° C.; Upper electrode temperature (e.g., electrode 70 in FIG. 5)=about 60° C.; Chamber wall temperature=about 60° C.; Backside helium pressure Center/Edge=about 10/35 Torr; and an etch time of approximately 120 to 180 seconds.

Pattern 435 is transferred to material layers 420A, 420B using the following exemplary process recipe: Chamber pressure=about 20 mTorr; Upper electrode RF power=about 3000 W; Lower electrode RF power=about 3800 W; Process gas flow rate C$_4$F$_6$/C$_5$F$_8$/Ar/O$_2$=about 5/25/500/40 sccm; about a 60 mm electrode spacing between the lower surface of electrode 70 (see FIG. 7) and the upper surface of substrate 25 on substrate holder 20; Lower electrode temperature (e.g., substrate holder 20 in FIG. 7)=about 20° C.; Upper electrode temperature (e.g., electrode 70 in FIG. 5)=about 60° C.; Chamber wall temperature=about 60° C.; Backside helium pressure Center/Edge=about 10/30 Torr; and an etch time of approximately 240 to 300 seconds.

The pattern formed in material layer 420A during the transfer of pattern 435 into material layer 420A is adjusted using a corrective etch process to provide a ratio of CDs (e.g., width-to-length ratio of a rectangular pattern) substantially equivalent to the initial ratio formed in the overlying mask layer(s). The corrective etch process may be an extension of the etch process, described above, to transfer pattern 435 into material layer 420A. The corrective etch process can include adjustments to the above described exemplary process recipe for transferring pattern 435 to material layer 420A.

Pattern 435 is transferred to intermediate sub-layer 425 using the following exemplary process recipe: Chamber pressure=about 100 mTorr; Upper electrode RF power=about 500 W; Lower electrode RF power=about 600 W; Process gas flow rate CF$_4$/CHF$_3$=about 120/30 sccm; about a 60 mm electrode spacing between the lower surface of electrode 70 (see FIG. 7) and the upper surface of substrate 25 on substrate holder 20; Lower electrode temperature (e.g., substrate holder 20 in FIG. 7)=about 20° C.; Upper electrode temperature (e.g., electrode 70 in FIG. 5)=about 60° C.; Chamber wall temperature=about 60° C.; Backside helium pressure Center/Edge=about 10/35 Torr; and an etch time of approximately 60 to 120 seconds.

Alternatively, pattern 435 is transferred to intermediate sub-layer 425 using the following exemplary recipe: Chamber pressure=about 30 mTorr; Upper electrode RF power=about 900 W; Lower electrode RF power=about 500 W; Process gas flow rate CH$_2$F$_2$/CHF$_3$/CO/Ar/O$_2$=about 25/30/70/150/30 sccm; about a 60 mm electrode spacing between the lower surface of electrode 70 (see FIG. 7) and the upper surface of substrate 25 on substrate holder 20; Lower electrode temperature (e.g., substrate holder 20 in FIG. 7)=about 20° C.; Upper electrode temperature (e.g., electrode 70 in FIG. 5)=about 60° C.; Chamber wall temperature=about 60° C.; Backside helium pressure Center/Edge=about 10/30 Torr; and an etch time of approximately 120 seconds.

Pattern 435 is transferred to insulation layer 415 using the following exemplary recipe: Chamber pressure=about 30 mTorr; Upper electrode RF power=about 900 W; Lower electrode RF power=about 500 W; Process gas flow rate CH$_2$F$_2$/CHF$_3$/CO/Ar/O$_2$=about 25/30/70/150/30 sccm; about a 60 mm electrode spacing between the lower surface of electrode 70 (see FIG. 7) and the upper surface of substrate 25 on substrate holder 20; Lower electrode temperature (e.g., substrate holder 20 in FIG. 7)=about 20° C.; Upper electrode temperature (e.g., electrode 70 in FIG. 5)=about 60° C.; Chamber wall temperature=about 60° C.; Backside helium pressure Center/Edge=about 10/30 Torr; and an etch time of approximately 120 seconds.

Following the transfer of pattern 435 to each layer in film stack 400, up to and including insulation layer 415, any remaining portion of hard mask layer 422 may be stripped using an ashing process (including any remaining portion of any layer above the hard mask layer 422). Thereafter, pattern 435 is transferred to the silicon substrate 410 using the following exemplary process recipe: Chamber pressure=about 100 to about 200 mTorr; Upper electrode RF power=about 800 W; Lower electrode RF power=about 2000 W; Process gas flow rate HBr/NF$_3$/O$_2$/SiF$_4$=about 500/300/50/20/20 sccm; about a 60 mm electrode spacing between the lower surface of electrode 70 (see FIG. 7) and the upper surface of substrate 25 on substrate holder 20; Lower electrode temperature (e.g., substrate holder 20 in FIG. 7)=about 90° C.; Upper electrode temperature (e.g., electrode 70 in FIG. 5)=about 80° C.; Chamber wall temperature=about 70° C.; Backside helium pressure Center/Edge=about 10/50 Torr; and an etch time of approximately 60 to 120 seconds.

Figure 11:
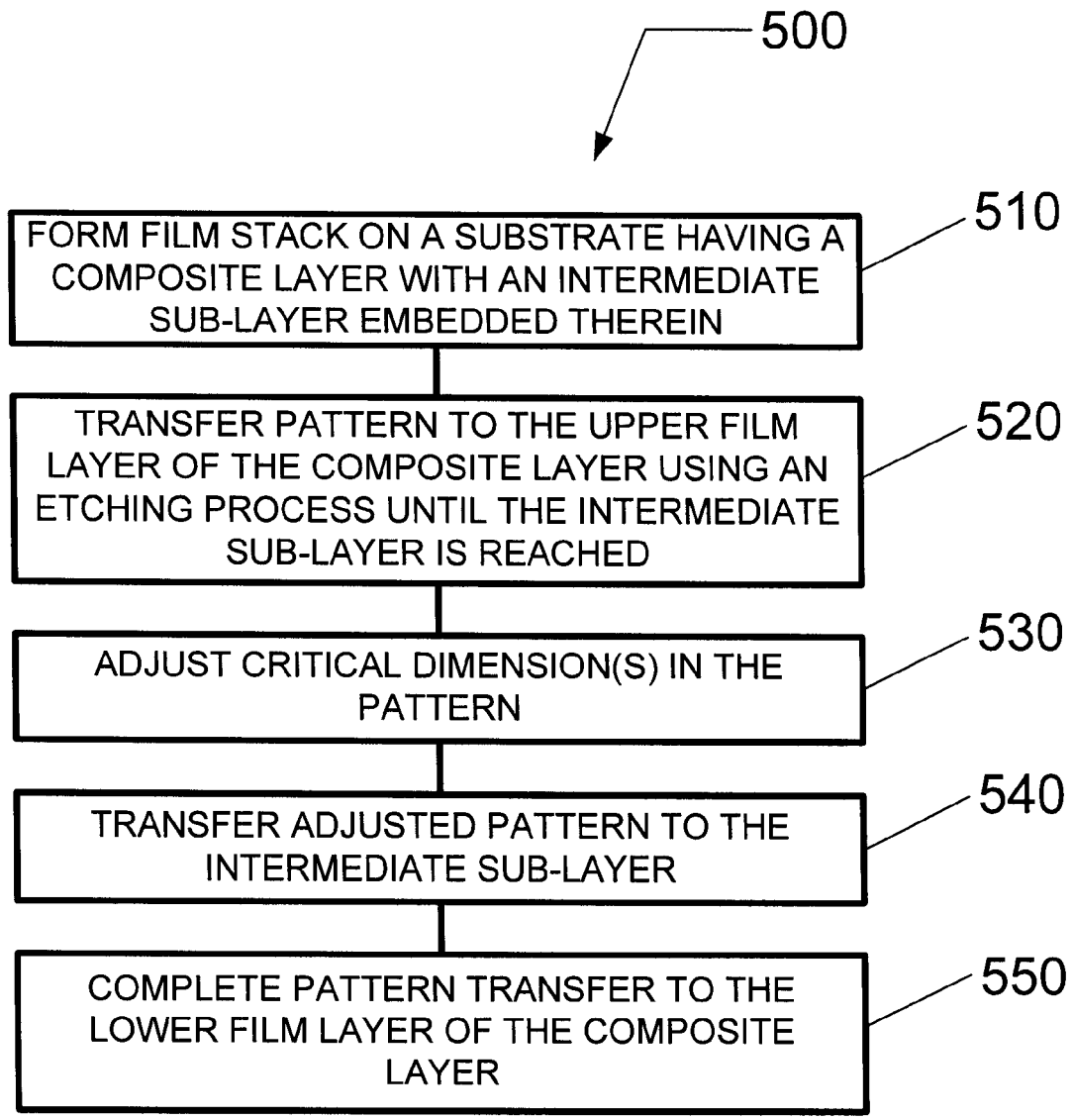
FIG. 11 illustrates a method of transferring a pattern to a layer on a substrate according to another embodiment of the invention.

FIG. 11 presents a flow chart of a method for etching a film stack using a plasma processing system according to an embodiment of the present invention. Procedure 500 begins at 510 with forming a film stack on a substrate, wherein the film stack comprises a composite layer. The composite layer includes two or more material layers between which reside intermediate sub-layers of a material composition different than that of the material layers.

In 520, a pattern formed in a mask layer, such as a lithographic mask, is transferred to the upper material layer using an etching process until the intermediate sub-layer is reached. In 530, once the intermediate sub-layer is reached, a corrective-etch process is performed to adjust at least one critical dimension (CD) of the pattern transferred to the upper material layer. For example, when the pattern includes a rectangular feature, the CD can include a feature width along a major axis, a feature width along a minor axis, or an aspect ratio (ratio of the two feature widths along the major and minor axes, respectively), or a combination of two or more thereof. Optionally, before the corrective-etch process, or after the corrective-etch process, or before and after the corrective-etch process, the at least one CD can be measured using, for instance, an optical diagnostic technique.

In 540, the adjusted pattern is transferred into the intermediate sub-layer. Thereafter, in 550, the adjusted pattern is transferred to the remaining portion of the composite layer.

Thereafter, any remaining portion of the mask layer may (optionally) be removed, and the patterned composite layer can be utilized to transfer the pattern to the underlying substrate.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method of etching a substrate, comprising:
   forming a film stack on said substrate, said film stack comprising a composite layer having an upper material layer, an intermediate sub-layer and a lower material layer, and a mask layer overlying said composite layer having a pattern formed therein; and
   transferring said pattern to said composite layer using one or more etching processes by:
   transferring said pattern to said upper material layer of said composite layer until said intermediate sub-layer is reached,
   adjusting at least one critical dimension (CD) of said pattern in said upper material layer,
   transferring the adjusted pattern in said upper material layer to said intermediate sub-layer, and
   transferring the adjusted pattern to said lower material layer of said composite layer,
   wherein said pattern comprises a rectangular pattern characterized by a first CD along a major axis of said pattern and second CD along a minor axis of said pattern, and
   wherein said adjusting comprises adjusting a ratio of said first CD to said second CD in said upper material layer of said composite layer such that said adjusted ratio in said upper material layer of said composite layer is substantially the same as an initial ratio of said first CD to said second CD in said mask layer.

2. The method of claim 1, wherein said adjusting comprises adjusting a width of said pattern.

3. The method of claim 1, wherein said adjusting comprises adjusting said first CD in said upper material layer of said composite layer, said second CD of said upper material layer in said composite layer, or a ratio of said first CD to said second CD in said upper material layer of said composite layer, or a combination of two or more thereof.

4. The method of claim 1, wherein said pattern in said mask layer comprises a pattern for a deep trench capacitor to be formed in said substrate using said composite layer as a hard mask.

5. The method of claim 1, wherein said adjusting comprises adjusting said at least one CD to correct for deviations to said CD from a nominal CD of said pattern in said mask layer during said transferring said pattern to said upper material layer of said composite layer.

6. The method of claim 1, wherein said forming comprises forming a multi-layer mask layer on said composite layer.

7. The method of claim 1, wherein said forming comprises forming a composite layer having an intermediate sub-layer of substantially different material composition than said upper material layer and said lower material layer.

8. The method of claim 1, wherein said transferring said pattern to said composite layer comprises using at least one etch process that selectively etches said upper material layer at a greater rate than said intermediate sub-layer and at least one other etch process that selectively etches said intermediate sub-layer at a greater rate than said upper material layer or said lower material layer or both.

9. The method of claim 1, wherein said adjusting comprises extending the etch process for transferring said pattern to said upper material layer for an over-etch time period.

10. The method of claim 1, wherein said adjusting comprises adjusting the etch process for transferring said pattern to said upper material layer and performing said adjusted etch process for a period of time to adjust said at least one CD.

11. The method of claim 1, further comprising:
    optionally removing said mask layer from said film stack; and
    transferring said pattern to said substrate.

12. The method of claim 11, wherein said forming comprises positioning said intermediate sub-layer within said composite layer such that said intermediate sub-layer serves as a stop layer for said transferring of said pattern to said substrate.

13. The method of claim 1, further comprising:
    measuring said at least one CD before said adjusting, or after said adjusting, or both before and after said adjusting.

14. The method of claim 13, wherein said measuring comprises measuring said at least one CD using an optical diagnostic technique.

15. A method of etching a substrate, comprising:
    forming a film stack on said substrate, said film stack comprising a composite layer having an upper material layer, an intermediate sub-layer and a lower material layer, and a mask layer overlying said composite layer having a pattern formed therein; and
    transferring said pattern to said composite layer using one or more etching processes by;
    transferring said pattern to said upper material layer of said composite layer until said intermediate sub-layer is reached,
    adjusting at least one critical dimension (CD) of said pattern in said upper material layer,
    transferring the adjusted pattern in said upper material layer to said intermediate sub-layer, and
    transferring the adjusted pattern to said lower material layer of said composite layer,
    wherein said transferring said pattern to said composite layer comprises transferring said pattern to said composite layer having a second intermediate layer below said lower material layer and a second lower material layer below said second intermediate layer, said transferring further comprising:
    adjusting at least one critical dimension (CD) of said pattern in said lower material layer,
    transferring the adjusted pattern in said lower material layer to said second intermediate sub-layer, and
    transferring the adjusted pattern in said lower material layer to said second lower material layer of said composite layer.

16. A method of etching a substrate, comprising:
    forming a film stack on said substrate, said film stack comprising a composite layer having an upper material layer, an intermediate sub-layer and a lower material layer, and a mask layer overlying said composite layer having a pattern formed therein; and
    transferring said pattern to said composite layer using one or more etching processes by;
    transferring said pattern to said upper material layer of said composite layer until said intermediate sub-layer is reached, adjusting at least one critical dimension (CD) of said pattern in said upper material layer, transferring the adjusted pattern in said upper material layer to said intermediate sub-layer, and transferring the adjusted pattern in said lower material layer to said composite layer, wherein said forming comprises forming a composite layer having an intermediate sub-layer of substantially different material composition than said upper material layer and said lower material layer, and wherein said intermediate sub-layer comprises silicon nitride ($Si_xN_y$) and said upper material layer and said lower material layer comprises silicon oxide ($SiO_z$), wherein atomic subscripts x, y, and z are integers having a value grater than or equal to unity.

* * * * *